United States Patent
Onishi et al.

(10) Patent No.: US 7,002,211 B2
(45) Date of Patent: Feb. 21, 2006

(54) LATERAL SUPER-JUNCTION SEMICONDUCTOR DEVICE

(75) Inventors: Yasuhiko Onishi, Nagano (JP);
Tatsuhiko Fujihira, Nagano (JP);
Susumu Iwamoto, Nagano (JP);
Takahiro Sato, Nagano (JP)

(73) Assignee: Fuji Electric Co., Ltd., (JP)

( * ) Notice: Subject to any disclaimer, the term of this patent is extended or adjusted under 35 U.S.C. 154(b) by 4 days.

(21) Appl. No.: 10/848,684

(22) Filed: May 19, 2004

(65) Prior Publication Data
US 2004/0212032 A1  Oct. 28, 2004

Related U.S. Application Data

(62) Division of application No. 09/844,481, filed on Apr. 27, 2001, now Pat. No. 6,756,636.

(30) Foreign Application Priority Data
Apr. 27, 2000  (JP) .............................. 2000-127021

(51) Int. Cl.
*H01L 29/66*  (2006.01)
(52) U.S. Cl. ..................... 257/342; 257/343; 257/341; 257/401; 257/492; 257/493

(58) Field of Classification Search ........ 257/341–343, 257/339, 401, 492, 493, 287, 409
See application file for complete search history.

(56) References Cited

U.S. PATENT DOCUMENTS

| | | | |
|---|---|---|---|
| 4,754,310 A | 6/1988 | Coe | 357/13 |
| 5,216,275 A | 6/1993 | Chen | 257/493 |
| 5,438,215 A | 8/1995 | Tihanyi | 257/401 |
| 5,710,455 A | 1/1998 | Bhatnagar et al. | 257/139 |
| 6,097,063 A | 8/2000 | Fujihira | 257/287 |
| 6,297,534 B1 | 10/2001 | Kawaguchi et al. | 257/341 |
| 6,492,691 B1 | 12/2002 | Magri' et al. | 257/401 |

FOREIGN PATENT DOCUMENTS

WO  WO 01/69682 A2  9/2001

*Primary Examiner*—Tom Thomas
*Assistant Examiner*—Matthew C Landau
(74) *Attorney, Agent, or Firm*—Rossi, Kimms & McDowell, LLP

(57) ABSTRACT

A lateral semiconductor device includes an alternating conductivity type layer for providing a first semiconductor current path in the ON-state of the device and for being depleted in the OFF-state of the device, that has an improved structure for realizing a high breakdown voltage in the curved sections of the alternating conductivity type layer.

15 Claims, 13 Drawing Sheets

LATERAL SUPER-JUNCTION SEMICONDUCTOR DEVICE

This is a Division of application Ser. No. 09/844,481 filed Apr. 27, 2001 U.S. Pat. No. 6,756,636.

FIELD OF THE INVENTION

The present invention relates to a semiconductor structure applicable to semiconductor devices such as MOSFET's (insulated gate field effect transistors), IGBT's (insulated gate bipolar transistors), bipolar transistors and diodes. More specifically, the present invention relates to a semiconductor device, which includes an alternating conductivity type layer that provides a current path in the ON-state of the semiconductor device and is depleted in the OFF-state of the semiconductor device.

BACKGROUND

Semiconductor devices may be roughly classified into lateral devices, in which the main electrodes thereof are arranged on one major surface, and vertical devices that distribute the main electrodes thereof on two major surfaces facing opposite to each other. In a vertical semiconductor device, a drift current flows vertically between the main electrodes in the ON-state of the device. To provide the vertical semiconductor device with a high breakdown voltage, it is necessary to thicken the highly resistive layer between the main electrodes. However, a thick, highly resistive layer inevitably causes high on-resistance that further increases loss. In other words, there exists a tradeoff relationship between the on-resistance (current capacity) and the breakdown voltage. The tradeoff relationship between the on-resistance and the breakdown voltage exists in semiconductor devices such as MOSFET's, IGBT's, bipolar transistors and diodes.

European Patent 0 053 854, U.S. Pat. No. 5,216,275, U.S. Pat. No. 5,438,215, and Japanese Unexamined Laid Open Patent Application H09-266311 disclose semiconductor devices, which include an alternating conductivity type layer formed of heavily doped n-type regions and heavily doped p-type regions alternately arranged to reduce the tradeoff relationship between the on-resistance and the breakdown voltage. The alternating conductivity type layer is depleted in the OFF-state of the semiconductor device to sustain the breakdown voltage. Hereinafter, the semiconductor device including an alternating conductivity type layer, that provides a current path in the ON-state of the device and is depleted in the OFF-state of the device, will be referred to as the "super-junction semiconductor device".

The tradeoff relationship between the on-resistance and the breakdown voltage also exists in lateral semiconductor devices, in which current flows laterally between the main electrodes arranged on one of the major surfaces in the ON-state thereof. Forming the drift layer thereof of an alternating conductivity type layer including n-type regions and p-type regions arranged alternately reduces the tradeoff relation in the lateral semiconductor devices.

FIG. 12 is a perspective view of a fundamental lateral super-junction MOSFET. FIG. 13(a) is a cross sectional view along A—A of FIG. 12. In these figures, oxide films and metal films, excluding a polycrystalline silicon gate electrode 9, are not illustrated for the sake of easy understanding. Referring to FIG. 12, the lateral super-junction MOSFET has a lateral double-diffused MODFET structure formed in the surface portion of a n-type layer 4 on a p-type substrate 5. A drain section 11 includes a n$^+$-type drain region 8 with low electrical resistance and a not shown drain electrode on n$^+$-type drain region 8. A source section 13 includes a p-type well region 6, a n$^+$-type source region 7 in the surface portion of p-type well region 6, and a not shown source electrode in contact with n$^+$-type source region 7 and p-type well region 6. An alternating conductivity type layer 12 is between drain section 11 and source section 13. A drift section, that is alternating conductivity type layer 12, includes a comb-shaped n-type drift region 1 and p-type partition regions 2 between the teeth of comb-shaped n-type drift region 1. Hereinafter, the teeth of comb-shaped n-type drift region 1 will be referred to simply as the "n-type drift regions 1". A drift current flows through n-type drift regions 1 of alternating conductivity type layer 12. Each region of alternating conductivity type layer 12 is from 1 to 10 $\mu$m in width and, preferably, from 1 to 4 $\mu$m in width. Alternating conductivity type layer 12 is from 1 to 10 $\mu$m in depth and, preferably, from 1 to 4 $\mu$m in depth. Alternating conductivity type layer 12 is around 50 $\mu$m in width for the MOSFET of the 600 V class and around 100 $\mu$m in width for the MOSFET of the 1000 V class.

In the lateral super-junction MOSFET configured as described above, a channel inversion layer 3 is formed below a gate electrode 9 when a voltage is applied between the drain electrode and the source electrode, and an appropriate voltage to gate electrode 9. Electrons flow into n-type drift regions 1 from n$^+$-type source region 7 via channel inversion layer 3. As a result, a drift current flows due to the electric field between the drain electrode and the source electrode (the ON-state of the device). When the voltage is removed from gate electrode 9, channel inversion layer 3 vanishes. Depletion layers expand from the pn-junctions between n-type drift regions 1 and p-type well region 6 and from the pn-junctions between n-type drift regions 1 and p-type partition regions 2 into n-type drift regions 1 and n-type layer 4 due to the voltage between the drain electrode and the source electrode. As a result, n-type drift regions 1 and n-type layer 4 are depleted (the OFF-state of the device).

The depletion layers from the pn-junctions between n-type drift regions 1 and p-type partition regions 2 expand in the width direction of n-type drift regions 1. Since n-type drift regions 1 are narrow, n-type drift regions 1 are depleted very fast. Since p-type partition regions are also depleted, alternating conductivity type layer 12 facilitates providing the lateral super-junction MOSFET with a high breakdown voltage. Since n-type drift regions 1 may be doped heavily, alternating conductivity type layer 12 facilitates lowering the on-resistance of the lateral super-junction MOSFET.

An ideal relation between the on-resistance and the breakdown voltage per a unit area is expressed by the following equation:

$$R=BV^2/(2N\beta^3 E_C{}^3 \epsilon_0 \epsilon_{Si} \mu) \tag{1}$$

where, R is the on-resistance per the unit area, BV the breakdown voltage, N the number of n-type drift regions 1 in alternating conductivity type layer 12, $\beta$ the unknown coefficient, $E_C$ the critical electric field at the impurity concentration of the n-type drift region, $\epsilon_0$ the dielectric permeability of the vacuum, $\epsilon_{Si}$ the relative dielectric permeability of silicon, and $\mu$ the electron mobility.

As equation (1) indicates, the on-resistance is reduced dramatically by increasing the number N of n-type drift regions 1 in the alternating conductivity type layer. This principle is described in detail in Japanese Unexamined Laid Open Patent Application H09-266311.

FIG. 13(b) is a cross sectional view of a conventional lateral super-junction MOSFET, that employs a double reduced surface electric field structure (a double RESURF structure). Referring to FIG. 13(b), a lightly doped p-type layer 15 is interposed between n-type layer 4 and alternating conductivity type layer 12. This structure facilitates providing the device with a high breakdown voltage, since depletion layers expand into n-type layer 4 from the pn-junction between n-type layer 4 and p-type layer 15 and from the pn-junction between n-type layer 4 and p-type substrate 5.

Japanese Unexamined Laid Open Patent Application H10-321567 describes that it is effective to equalize the impurity concentrations and the widths of n-type drift regions 1 and p-type partition regions 2 for reducing the tradeoff relation between the on-resistance and the breakdown voltage and for realizing a high breakdown voltage. The means and the techniques disclosed in the foregoing publications for reducing the tradeoff relation between the on-resistance and the breakdown voltage are, however, still experimental and not always sufficient considering the mass-production.

As described in Japanese Unexamined Laid Open Patent Application H09-266311, the alternating conductivity type layers disclosed so far have been described only for the straight sections thereof, through which a drift current flows. Nothing has been described so far for the corner section, the bent section and such a curved section of the alternating conductivity type layer. It is difficult in practice for the lateral semiconductor devices to realize a high breakdown voltage without the structure of the curved section thereof. It is important to consider the structure of the curved section for relaxing the electric field in the curved section.

In view of the foregoing, it would be desirable to provide a lateral semiconductor device having an improved structure in the curved section thereof for providing the device with a high breakdown voltage. It would further be desirable to provide a lateral semiconductor device, that facilitates reducing the tradeoff relation between the on-resistance and the breakdown voltage and realizing a high breakdown voltage, and that is suited for mass-production.

SUMMARY OF THE INVENTION

According to an aspect of the present invention, there is provided a lateral semiconductor device including: a semiconductor chip; two main electrodes on one of the major surfaces of the semiconductor chip; an alternating conductivity type layer between the main electrodes; the alternating conductivity type layer including drift regions of a first conductivity type and partition regions of a second conductivity type; the drift regions and the partition regions being arranged alternately; and the alternating conductivity type layer being a closed loop surrounding one of the main electrodes.

In order to apply a high voltage between the drain section and the source section, it is necessary for the drain section and the source section to be spaced widely apart from each other. Or, it is necessary for the alternating conductivity type layer between the drain section and the source section to form a closed loop. Since the area of the semiconductor substrate is limited, it is hard to space the drain section and the source section away from each other.

Advantageously, the alternating conductivity type layer includes first sections, wherein the drift regions and the partition regions are arranged alternately at a first pitch, and second sections, wherein the drift regions and the partition regions are arranged alternately at a second pitch different from the first pitch. By appropriately selecting the locations of the first sections and the second sections, the breakdown voltage is prevented from being lowered in a part of the alternating conductivity type layer.

Advantageously, the alternating conductivity type layer includes one or more straight sections and one or more curved sections. By the configuration described above, the closed loop of the alternating conductivity type layer is easily formed. Preferably, the alternating conductivity type layer includes two or more straight sections and two or more curved sections. Alternatively the alternating conductivity type layer includes four or more straight sections and four or more curved sections.

Advantageously, the drift regions and the partition regions are arranged alternately at the first pitch in the straight sections and the drift regions and the partition regions are arranged alternately at the second pitch in the curved sections. By arranging the drift regions and the partition regions in the curved sections at the second pitch different from the first pitch in the straight sections, the arrangement of the drift regions and the partition regions in the curved sections is well balanced.

Advantageously, the first pitch is equal to or longer than the second pitch. By arranging the drift regions and the partition regions in the curved sections alternately at the short second pitch, depletion layers expand faster in the curved sections than in the straight sections when a reverse bias voltage is applied. As a result, the surface electric fields in the curved sections are relaxed.

Advantageously, the curved sections are doped substantially more lightly than the straight sections. Since the alternating conductivity type layer is depleted faster as the impurity concentration is lowered, the surface electric field is relaxed and the alternating conductivity type layer is provided with a higher breakdown voltage.

Advantageously, the curved sections are substantially intrinsic. When the curved sections are substantially intrinsic, the curved sections are depleted the fastest. Since the depletion layer expands easily into the substantially lightly doped region, the substantial impurity concentration thereof is low, and when a reverse bias voltage is applied, the electric field is relaxed and the substantially lightly doped region is provided with a high breakdown voltage.

Advantageously, the curved sections are doped with an n-type impurity and a p-type impurity. A substantially intrinsic impurity concentration is realized by doping an n-type impurity and a p-type impurity. When the impurity concentration in the curved section is very low, the second pitch in the curved section (longer than the first pitch in the straight section) poses no problem. When the impurity concentration in the curved section is very low, the curved section does not necessarily include any alternating conductivity type layer.

Advantageously, the width of the curved section is larger than the width of the straight section. Since the depleted area of the curved section is increased when the width of the curved section is larger than the width of the straight section, the curved section is provided with a higher breakdown voltage.

Advantageously, the lateral super-junction semiconductor device further includes one or more closed loops, each including an alternating conductivity type layer.

Advantageously, the width of the drift region or the partition region is from ¼ to 4 times as large as the depth of the drift region or the partition region. It is difficult to form the drift region or the partition region since the depth thereof is much larger than the width thereof. When the width of the drift region or the partition region is much larger than the depth thereof, it is difficult to deplete the drift region or the partition region. Therefore, the above-described relation between the width and the depth of the drift region or the partition region is preferable.

Advantageously, the width of the alternating conductivity type layer is from 12.5 to 100 times as large as the width or the depth of the drift region or the partition region. When the ratio of the width of the alternating conductivity type layer and the width or the depth of the drift region or the partition region is less than 10, it is difficult to obtain a high breakdown voltage. When the ratio of the width of the alternating conductivity type layer and the width or the depth of the drift region or the partition region is more than 100, the surface area of the semiconductor substrate is occupied by the alternating conductivity type layer too widely, or it is difficult to form such a wide alternating conductivity type layer.

Advantageously, the lateral super-junction semiconductor device is a MOSFET, the drain electrode thereof is inside the closed loop, and the source electrode thereof is outside the closed loop. When a high voltage is applied to the drain electrode, which is inside the closed loop, the source electrode, having a wide area, is on the low potential side.

Advantageously, the lateral super-junction semiconductor device further includes a circuit for controlling the semiconductor device, for protecting the semiconductor device, and for detecting the states of the semiconductor device; the circuit being outside the closed loop. The lateral super-junction semiconductor device according to the invention is applicable to semiconductor apparatus, which include the lateral super-junction semiconductor device and also the circuit for controlling, protecting, and for detecting the states of the semiconductor device.

BRIEF DESCRIPTION OF THE DRAWINGS

The invention will now be described with reference to certain preferred embodiments thereof and the accompanying drawings, wherein:

FIG. 5($b$) is a cross sectional view along D—D of FIG. 4;

FIG. 8($b$) is a cross sectional view of a modified n-channel lateral super-junction MOSFET, which employs a double RESURF structure;

FIG. 8($c$) is a cross sectional view of another modified n-channel lateral super-junction MOSFET, which does not employ any intrinsic layer;

FIG. 8($d$) is a cross sectional view of still another modified n-channel lateral super-junction MOSFET, which does not also employ any intrinsic layer;

FIG. 13($b$) is a cross sectional view of a conventional lateral super-junction MOSFET, that employs a double reduced surface electric field structure (a double RESURF structure).

DETAILED DESCRIPTION OF THE PREFERRED EMBODIMENTS

In the present disclosure, the term "width" refers to the dimension of the first and second semiconductor regions 1, 2 along the pitch direction P1, P2. The terms "lateral width" refers to the dimension of the first and second semiconductor regions 1, 2 perpendicular to the pitch direction P1, P2.

First Embodiment

Figure 2:
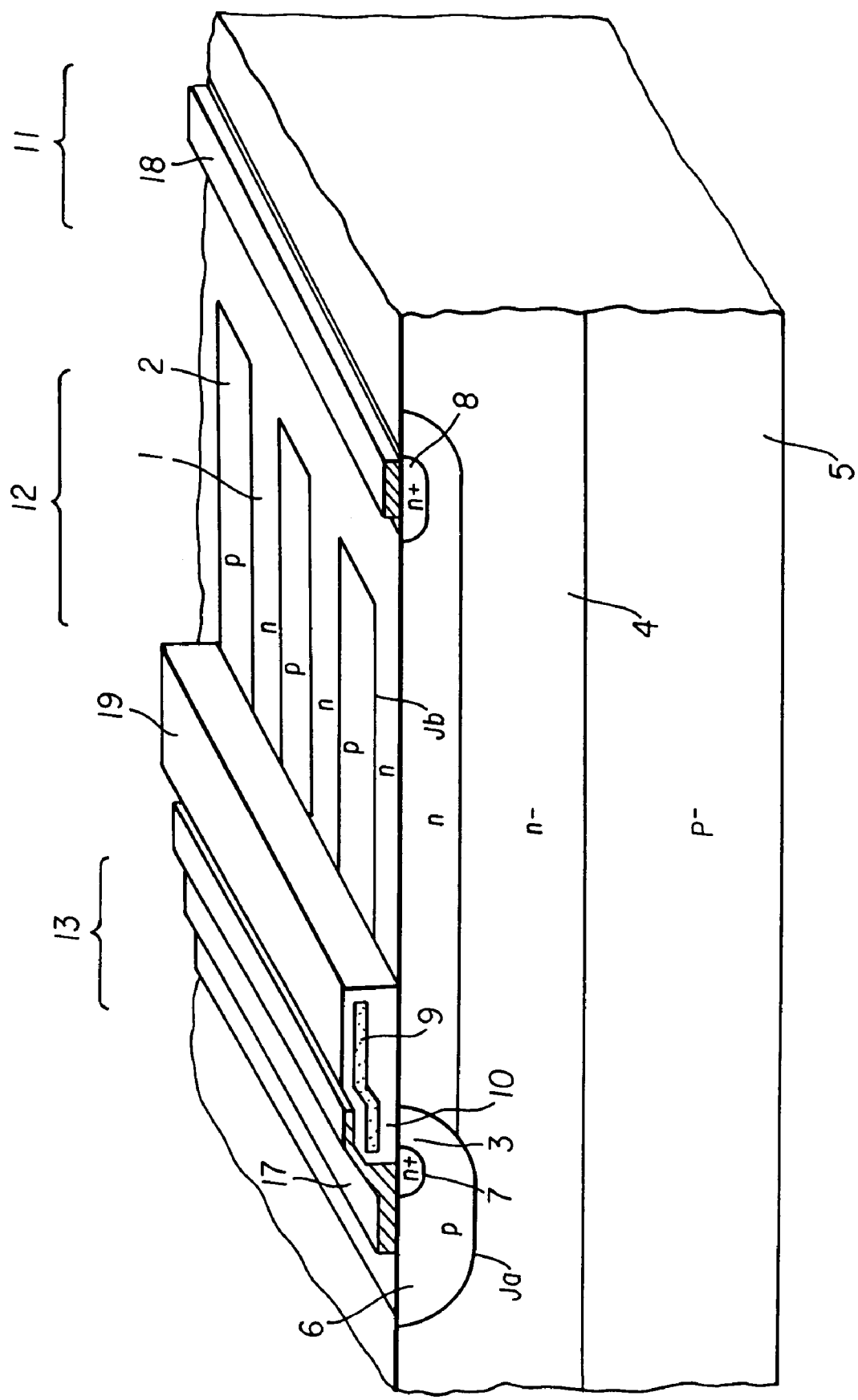
FIG. 2 is a perspective view of the n-channel lateral super-junction MOSFET according to the first embodiment of the invention.

FIG. 2 is a perspective view of an n-channel lateral super-junction MOSFET according to a first embodiment of the invention. In the following descriptions, the n-type layer or the n-type region is a layer or a region; therein electrons are the major carriers. The p-type layer or the p-type region is a layer or a region; therein holes are the major carriers. The suffix "+" on the right shoulder of the letter "n" or "p" indicating the conductivity type of the layer or the region indicates the relevant region or the layer is doped relatively heavily. The suffix "" on the right shoulder of the letter "n" or "p" indicating the conductivity type of the layer or the region indicates the region or the layer is doped relatively lightly.

Referring now to FIG. 2, a semiconductor chip is formed of a p-type substrate 5 and an n-type layer 4 on p-type substrate 5. A p-type well region 6 is in the surface portion of n-type layer 4. A n$^+$-type source region 7 is in p-type well region 6. A n$^+$-type drain region 8 is in the surface portion of the semiconductor chip. The n$^+$-type drain region 8 and p-type well region 6 are spaced apart from each other. An alternating conductivity type layer 12, formed of n-type drift regions 1 and p-type partition regions 2 alternately arranged, is found between p-type well region 6 and n$^+$-type drain region 8. A polycrystalline silicon gate electrode 9 is above the extended portion of p-type well region 6 which is extended between n$^+$-type source region 7 and alternating conductivity type layer 12 with a gate oxide film 10 interposed therebetween. A source electrode 17 is in common contact with n$^+$-type source region 7 and p-type well region 6. A drain electrode 18 is on n$^+$-type drain region 8. An interlayer insulation film 19, formed of a thermally oxidized film, a phosphate silicate glass (PSG) or such an insulation film, is disposed for surface protection and for surface stabilization. As shown in FIG. 2, source electrode 17 is extended very often above gate electrode 9 with interlayer insulation film 19 interposed therebetween.

The n-type drift regions 1 and p-type partition regions 2 are formed in the surface portion of n-type layer 4 by ion implantation and by subsequent thermal drive. The typical dimensions and impurity concentrations of the constituent elements of the MOSFET of the 600 V class are as follows: the impurity concentration in p-type substrate 5 is $2 \times 10^{13}$ cm$^3$, the thickness of p-type substrate 5 is 350 μm; the thickness of n-type layer 4 is 50 μm; the impurity concentration in n-type layer 4 is $2 \times 10^{14}$ cm$^3$; the width of n-type drift region 1 is 5 μm; the width of p-type partition region 2 is 5 μm. That is, the spacing between the centers of n-type drift region 1 and p-type partition region 2 is 10 μm; the width of the alternating conductivity type layer 12 is 50 μm; the impurity concentration in alternating conductivity type layer 12 is $3 \times 10^{15}$ cm$^3$; the diffusion depth of alternating conductivity type layer 12 is 1 μm; the diffusion depth of p-type well region 6 is 2 μm; the surface impurity concentration of p-type well region 6 is $3 \times 10^{18}$ cm$^3$; the diffusion depth of n$^+$-type source region 7 is 0.3 μm; the surface impurity concentration of n$^+$-type source region 7 is $1 \times 10^{20}$ cm$^3$.

Figure 1:
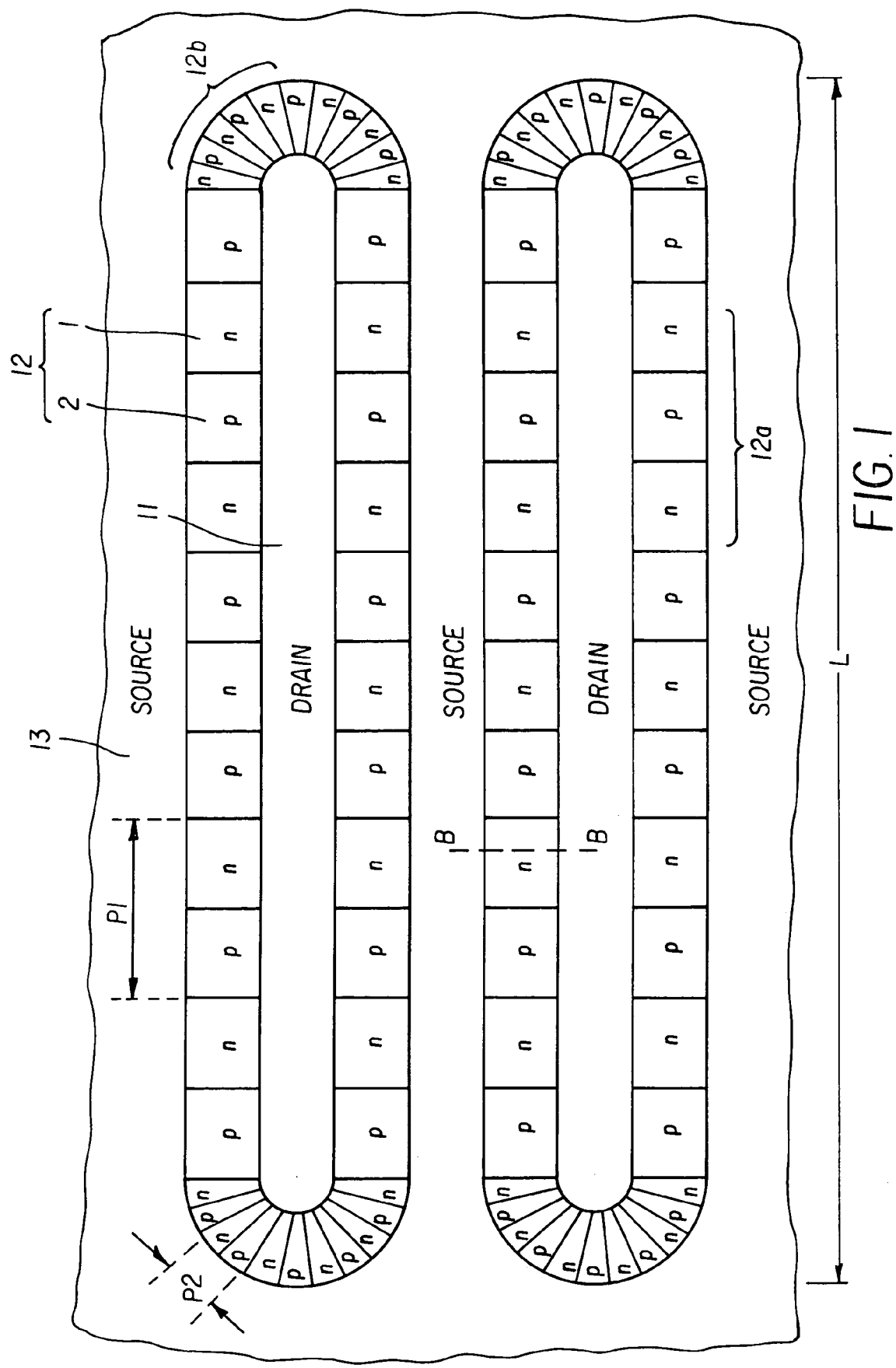
FIG. 1 is a top plan view of an n-channel lateral super-junction MOSFET according to a first embodiment of the invention.

FIG. 1 is a top plan view of the n-channel lateral super-junction MOSFET according to the first embodiment of the invention. In FIG. 1, only alternating conductivity type layers 12, drain sections 11, and a source section 13 are shown for the sake of easy understanding. Referring to FIG. 1, alternating conductivity type layer 12 is a closed loop formed of straight sections 12a and curved sections 12b. In straight section 12a, n-type drift regions 1 and p-type partition regions are arranged alternately at a pitch of repeating (hereinafter referred to simply as a "pitch") P1. In curved section 12b, n-type drift regions 1 and p-type partition regions 2 are arranged alternately at a maximum pitch P2. The closed loop of alternating conductivity type layer 12 is around drain section 11. The pitch P1 in straight section 12a is 10 μm. The maximum pitch P2 in curved section 12b is 8 μm. Since the widths of n-type drift region 1 and p-type partition regions 2 change in the radial direction in curved section 12b, the maximum widths of n-type drift region 1 and p-type partition regions 2 are used to calculate the maximum pitch P2 for curved section 12b. Source section 13 is outside the closed loops of alternating conductivity type layer 12. The length L of the closed loop of alternating conductivity type layer 12 is determined by the current capacity. Usually, the closed loop length L is an order of several mm. The perspective view of the cross section along B—B of FIG. 1 is shown in FIG. 2.

The MOSFET according to the first embodiment operates in the following way. When a predetermined positive voltage is applied to gate electrode 9, a channel inversion layer 3 is created in the surface portion of a p-type well region beneath gate electrode 9. Electrons are injected from n$^+$-type source region 7 into n-type drift regions 1 via channel inversion layer 3. The injected electrons reach n$^+$-type drain region 8, connecting drain electrode 18 and source electrode 17 electrically.

When the positive voltage is removed from gate electrode 9, channel inversion layer 3 vanishes, disconnecting the drain electrode 18 and the source electrode 17 electrically from each other. As the bias voltage between drain electrode 18 and source electrode 17 is further increased, depletion layers expand from the pn-junctions Ja between p-type well region 6 or p-type partition regions 2 and n-type layer 4 and from the pn-junctions Jb between n-type drift regions 1 and p-type partition regions 2, depleting n-type drift regions 1 and p-type partition regions 2. Since the depletion layer edges advance in the width direction of n-type drift regions 1 from the boundaries of p-type partition regions 2 on both sides, n-type drift regions 1 are depleted very quickly. Therefore, n-type drift regions 1 may be doped heavily.

At the same time, p-type partition regions 2 are depleted. Since the depletion layer edges advance in the width direction of p-type partition regions 2 from the boundaries of n-type drift regions 1 on both sides, p-type partition regions 2 are also depleted very quickly. Since the depletion layer edges advance from p-type partition region 2 into adjacent n-type drift regions 1 due to the alternate arrangement of n-type drift regions 1 and p-type partition regions 2, the total area occupied by p-type partition region 2 may be halved. Therefore, the cross sectional area of n-type drift regions 1 may be widened corresponding to the reduced total area of p-type partition regions 2.

When the maximum pitch P2 in curved sections 12b of alternating conductivity type layer 12 is longer than the pitch P1 in straight sections 12a, straight sections 12a of alternating conductivity type layer 12 are completely depleted by connecting gate electrode 9 and source electrode 17 electrically, and by applying a positive voltage to drain electrode 18. However, the electric field strength in curved sections 12b reaches the critical value at a voltage lower than the breakdown voltage of straight sections 12a, since imbalance of the impurity amounts is caused in curved sections 12b due to the curvature thereof. Therefore, a sufficiently high breakdown voltage is not obtained.

When the maximum pitch P2 in curved sections 12b of alternating conductivity type layer 12 is shorter than the pitch P1 in straight sections 12a, curved sections 12b are depleted faster than straight sections 12a, since the impurity amounts in curved sections 12b are well balanced and since the widths of n-type drift regions 1 and p-type partition regions 2 in curved sections 12b, for which depletion layers expand, are narrower than the widths of n-type drift regions 1 and p-type partition regions 2 in straight sections 12a. Therefore, the electric field in curved sections 12b is relaxed and a high breakdown voltage is obtained.

Second Embodiment

Figure 3:
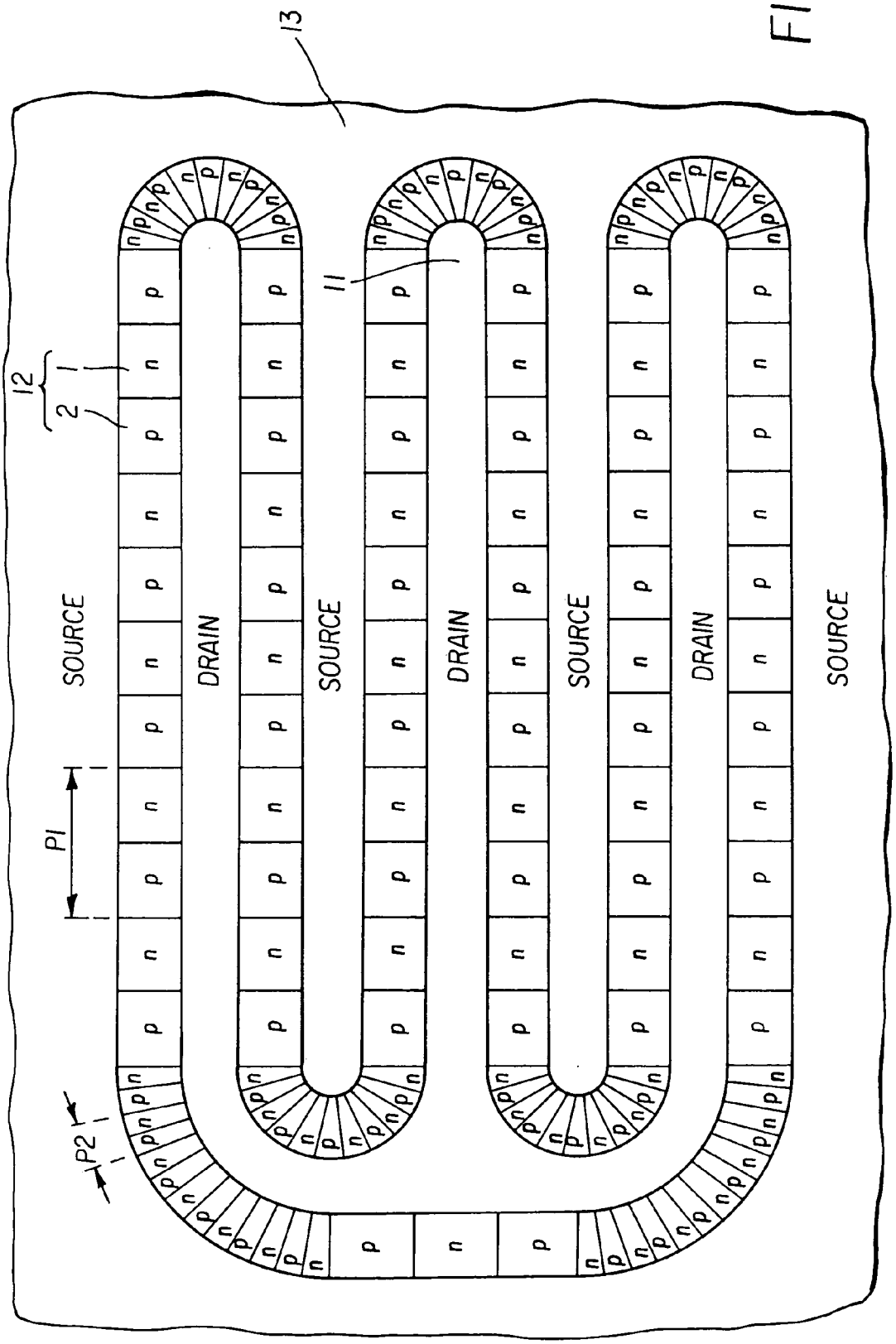
FIG. 3 is a top plan view of an n-channel lateral super-junction MOSFET according to a second embodiment of the invention.

FIG. 3 is a top plan view of an n-channel lateral super-junction MOSFET according to a second embodiment of the invention. Referring to FIG. 3, the closed loop of an alternating conductivity layer 12 is formed of straight sections 12a and curved sections 12b. According to the second embodiment, the pitch P1 in straight section 12a is 10 μm, and the maximum pitch P2 in curved section 12b is 8 μm. That is, the maximum pitch P2 in curved section 12b is shorter than the pitch P1 in straight section 12a. The closed loop of alternating conductivity layer 12 surrounds drain section 11, and source section 13 is outside the closed loop of alternating conductivity layer 12 in the same manner as according to the first embodiment. The closed loop of alternating conductivity layer 12 according to the first embodiment is a simple one formed of two straight sections 12a and two curved sections 12b. The closed loop of alternating conductivity layer 12 according to the second embodiment is a complex one formed of seven straight sections 12a and seven curved sections 12b.

The complexity closed loop of alternating conductivity layer 12 as shown in FIG. 3 facilitates forming one single drain electrode in drain section 11 and utilizing the surface area of the semiconductor substrate efficiently.

Third Embodiment

Figure 4:
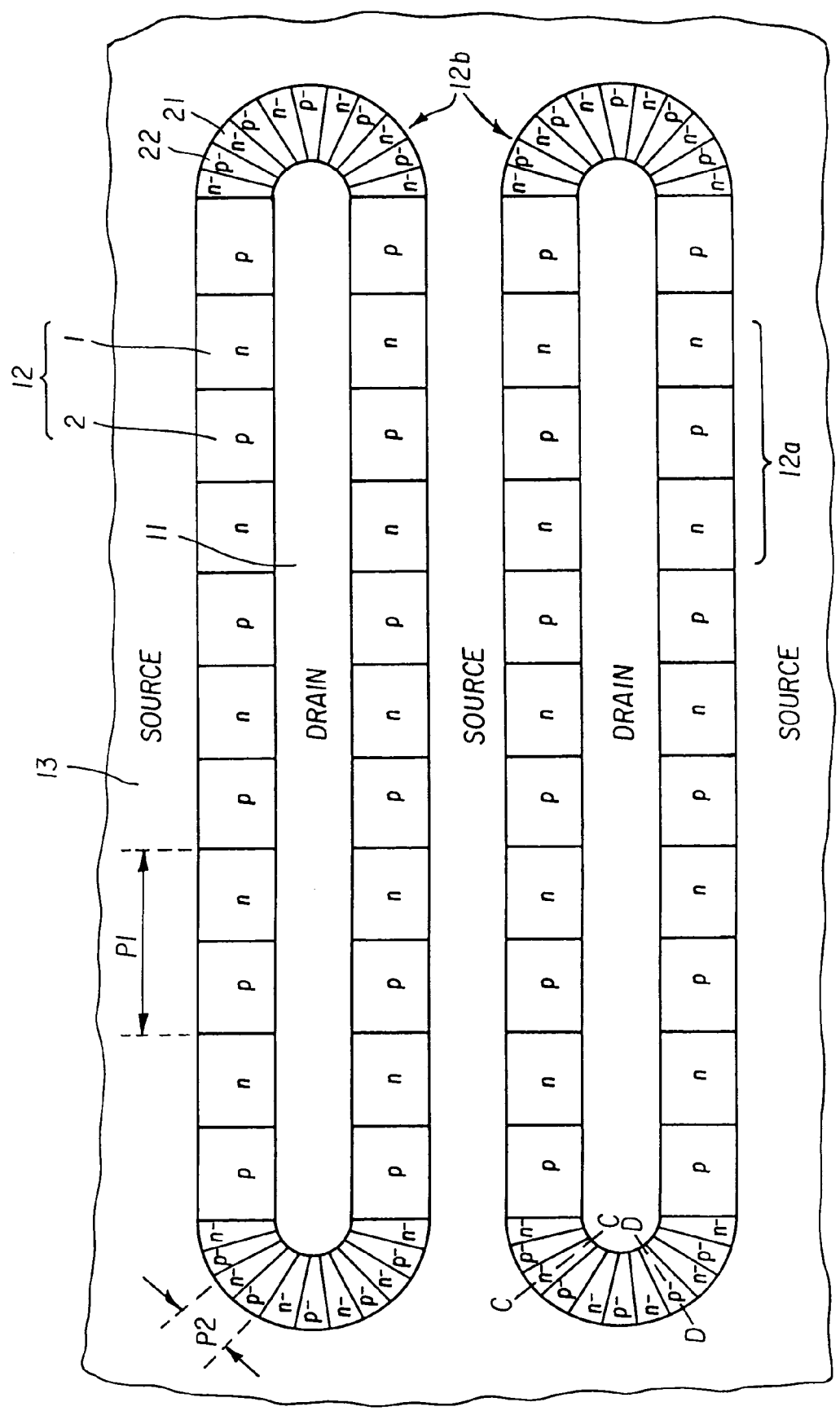
FIG. 4 is a top plan view of an n-channel lateral super-junction MOSFET according to a third embodiment of the invention.
Figure 5A:
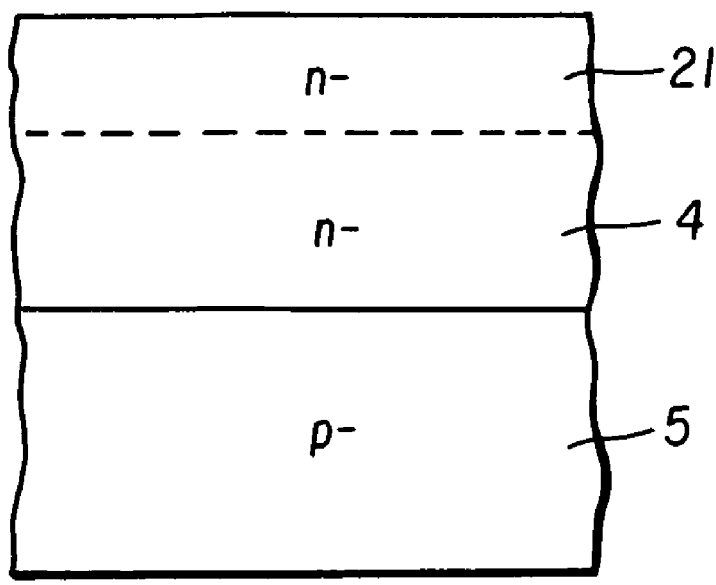
FIG. 5($a$) is a cross sectional view along C—C of FIG. 4.
Figure 5B:
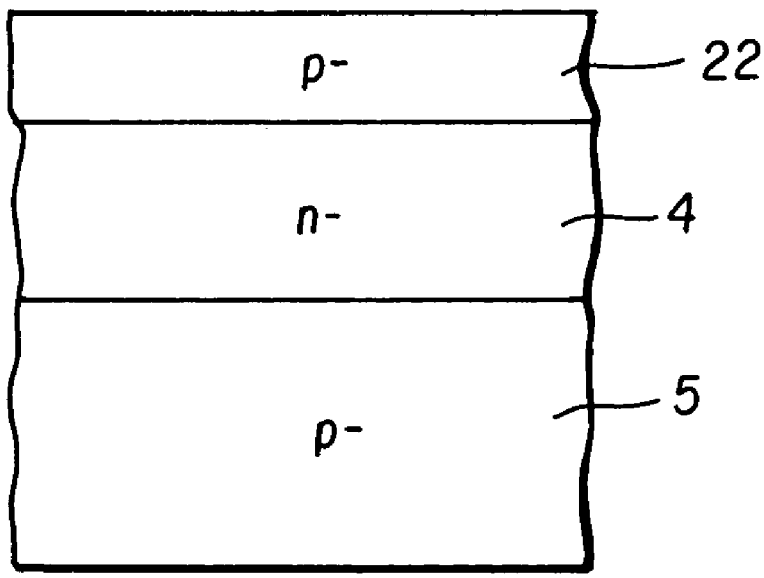

FIG. 4 is a top plan view of an n-channel lateral super-junction MOSFET according to a third embodiment of the invention. FIG. 5(a) is a cross sectional view along C—C of FIG. 4. FIG. 5(b) is a cross sectional view along D—D of FIG. 4.

Referring now to FIG. 4, the closed loop of an alternating conductivity layer 12 is formed of two straight sections 12a and two curved sections 12b. According to the third embodiment, the pitch P1 in straight section 12a is 10 82 m, and the maximum pitch P2 in curved section 12b is 8 µm. In curved section 12b, the impurity concentration in an n-type drift region 21 is as low as the impurity concentration in n-type layer 4, and the impurity concentration in a p-type partition region 22 is as low as the impurity concentration in n-type layer 4. In straight sections 12a, the impurity concentration in n-type drift region 1 and the impurity concentration in p-type partition region 2 are $3\times10^{15}$ cm$^3$ each in the same manner as according to the first and second embodiments.

As the impurity concentration is lower, the depletion layer expands faster. Curved section 12b is depleted faster than straight section 12a according to the third embodiment. Therefore, the curved section 12b, when the electric field thereof is relaxed, exhibits a high breakdown voltage.

Fourth Embodiment

Figure 6:
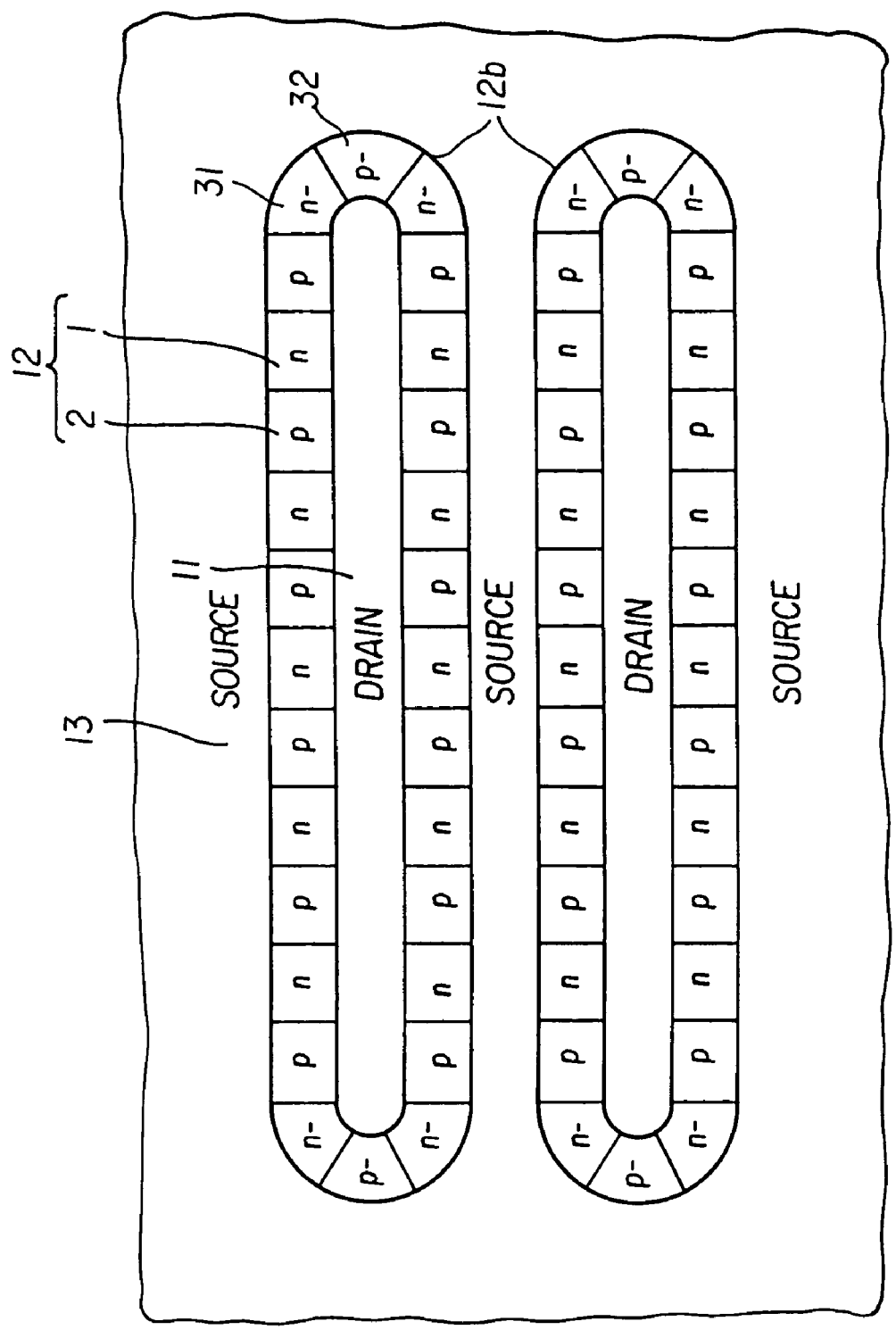
FIG. 6 is a top plan view of an n-channel lateral super-junction MOSFET according to a fourth embodiment of the invention.

FIG. 6 is a top plan view of an n-channel lateral super-junction MOSFET according to a fourth embodiment of the invention.

Referring now to FIG. 6, the closed loop of an alternating conductivity layer 12 is formed of straight sections 12a and curved sections 12b. According to the fourth embodiment, the pitch P1 in straight section 12a is 10 m, and the maximum pitch P2 in curved section 12b is 15 m. That is, the maximum pitch P2 in curved section 12b is longer than the pitch P1 in straight section 12a. Since depletion layers expand quickly in curved sections 12b when the impurity concentrations in n-type drift regions 31 and p-type partition regions 32 are low enough, the maximum pitch P2 in curved section 12b longer than the pitch P1 in straight section 12a does not pose any problems.

Fifth Embodiment

Figure 7:
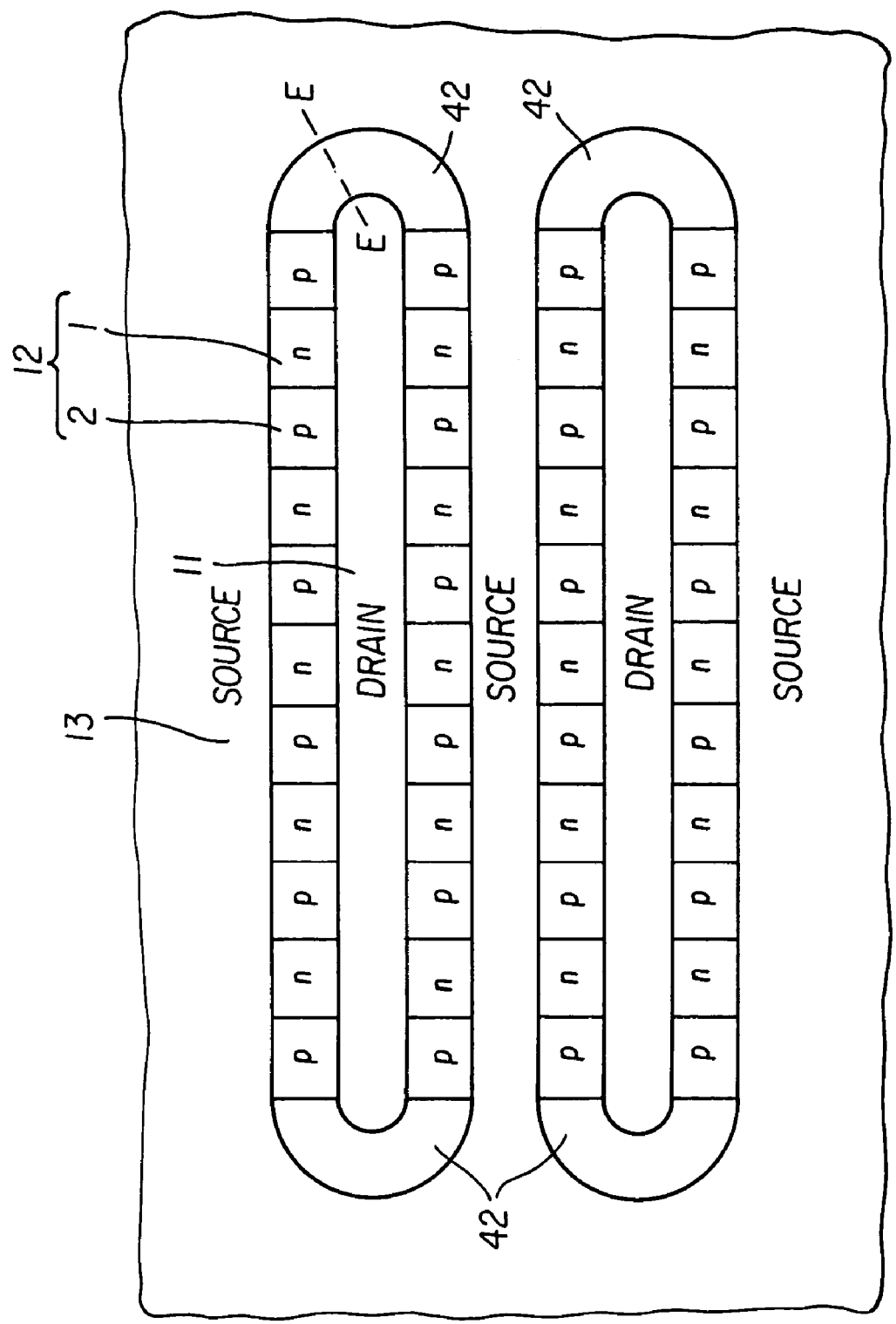
FIG. 7 is a top plan view of an n-channel lateral super-junction MOSFET according to a fifth embodiment of the invention.
Figure 8A:
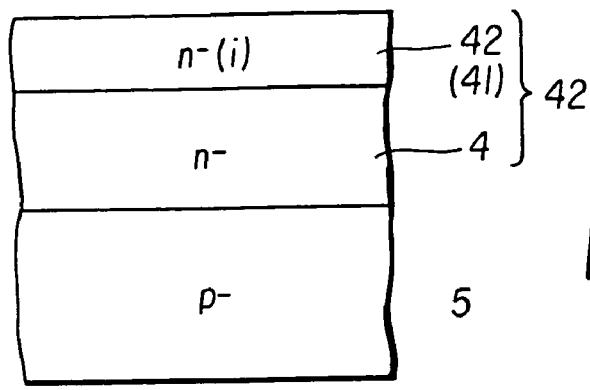
FIG. 8($a$) is a cross sectional view along E—E of FIG. 7.

FIG. 7 is a top plan view of an n-channel lateral super-junction MOSFET according to a fifth embodiment of the invention. FIG. 8(a) is a cross sectional view along E—E of FIG. 7. Curved section 12b of alternating conductivity type layer 12 in the super-junction MOSFET according to the fifth embodiment is not formed of n-type regions nor p-type regions but of one single, lightly doped region 42. In straight sections 12a, the impurity concentration in n-type drift region 1 and the impurity concentration in p-type partition region 2 are each $3\times10^{15}$ cm$^3$ in the same manner as according to the first and second embodiments.

In the extreme case, wherein the impurity concentrations are very low, curved section 12b may be formed of one single intrinsic region 41. Alternatively, curved section 12b may be formed of a substantially lightly doped laminate 42 including an n-type layer 42a or an intrinsic layer 41 and n-type layer 4 as shown in FIG. 8(a). When curved section 12b is almost intrinsic, the electric field thereof is relaxed and, therefore, intrinsic curved section 12b facilitates obtaining a higher breakdown voltage.

Intrinsic region 41 or lightly doped region 42 is formed by doping an n-type impurity and a p-type impurity. When a region contains the same amounts of an n-type impurity and a p-type impurity, the region is very resistive, since the n-type impurity and the p-type impurity counterbalance each other. Lightly doped region 42 is an n-type region or a p-type region, wherein the amount of the n-type impurity and the amount of the p-type impurity differ slightly from each other. The n-type region or the p-type region for lightly doped region 42 poses no problem.

A layer formed of an adjoining n-type layer and a p-type layer works as a very resistive layer, since the n-type impurity and the p-type impurity compensate for each other when the amounts thereof are almost the same.

Figure 8B:
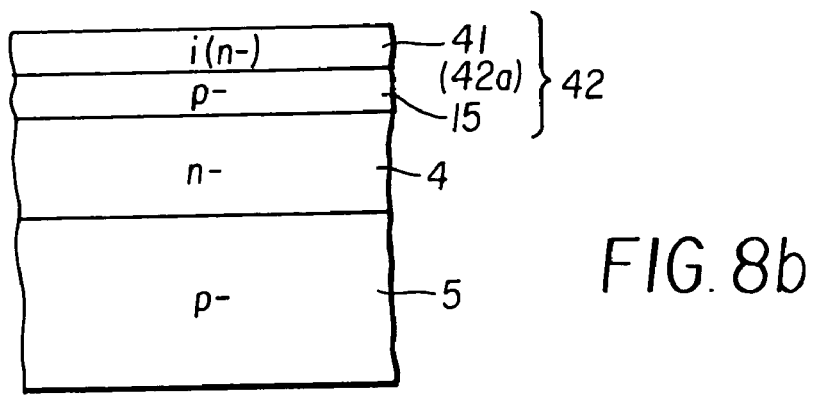

FIG. 8(b) is a cross sectional view of a modified n-channel lateral super-junction MOSFET that employs a double RESURF structure. The n-channel lateral super-junction MOSFET shown in FIG. 8(b) is a modification of the n-channel lateral super-junction MOSFET shown in FIG. 8(a). Referring now to FIG. 8(b), curved section 12b is formed of a substantially lightly doped laminate 42 including n-type layer 4, a p-type layer 15, and an intrinsic layer 41 or a lightly doped n-type layer 42a. The n-channel lateral super-junction MOSFET shown in FIG. 8(b) is also useful.

Figure 8C:
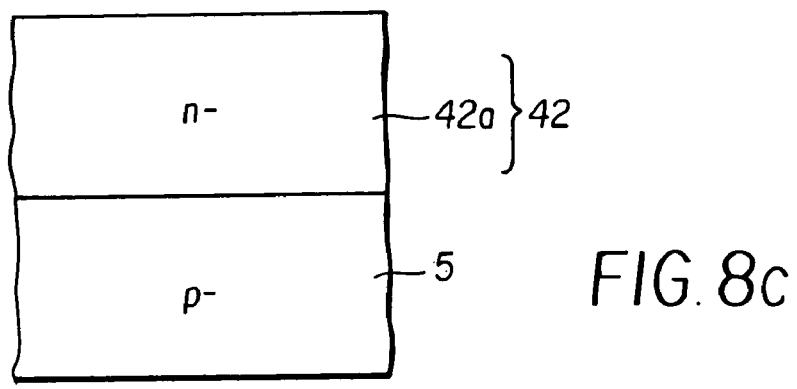

FIG. 8(c) is a cross sectional view of another modified n-channel lateral super-junction MOSFET, which does not employ any intrinsic layer. In FIG. 8(c), region 42 doped substantially lightly is formed of an n-type layer 42a, the substantial impurity concentration thereof is adjusted at a certain value, preferably lower than the impurity concentration of n-type layer 4.

Figure 8D:
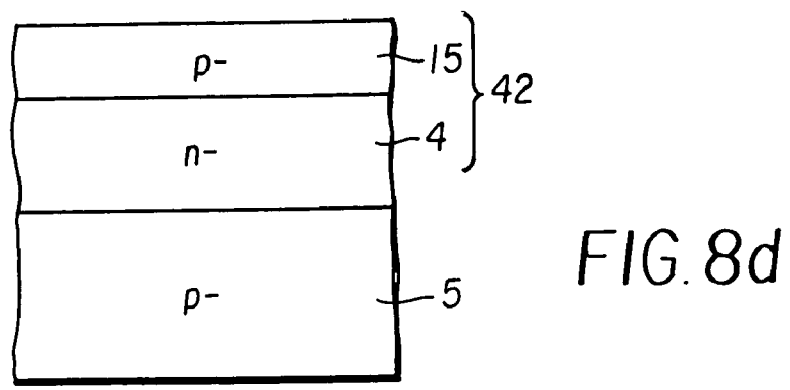

FIG. 8(d) is a cross sectional view of still another modified n-channel lateral super-junction MOSFET, which does not employ any intrinsic layer. In FIG. 8(c), laminate 42 doped substantially lightly is formed of n-type layer 4 and a p-type layer 15.

Although the modified n-channel lateral super-junction MOSFET's which do not employ any intrinsic layer are not so effective in obtaining a high breakdown voltage as compared to the n-channel lateral super-junction MOSFET which includes an intrinsic region, their structures are simple.

Sixth Embodiment

Figure 9:
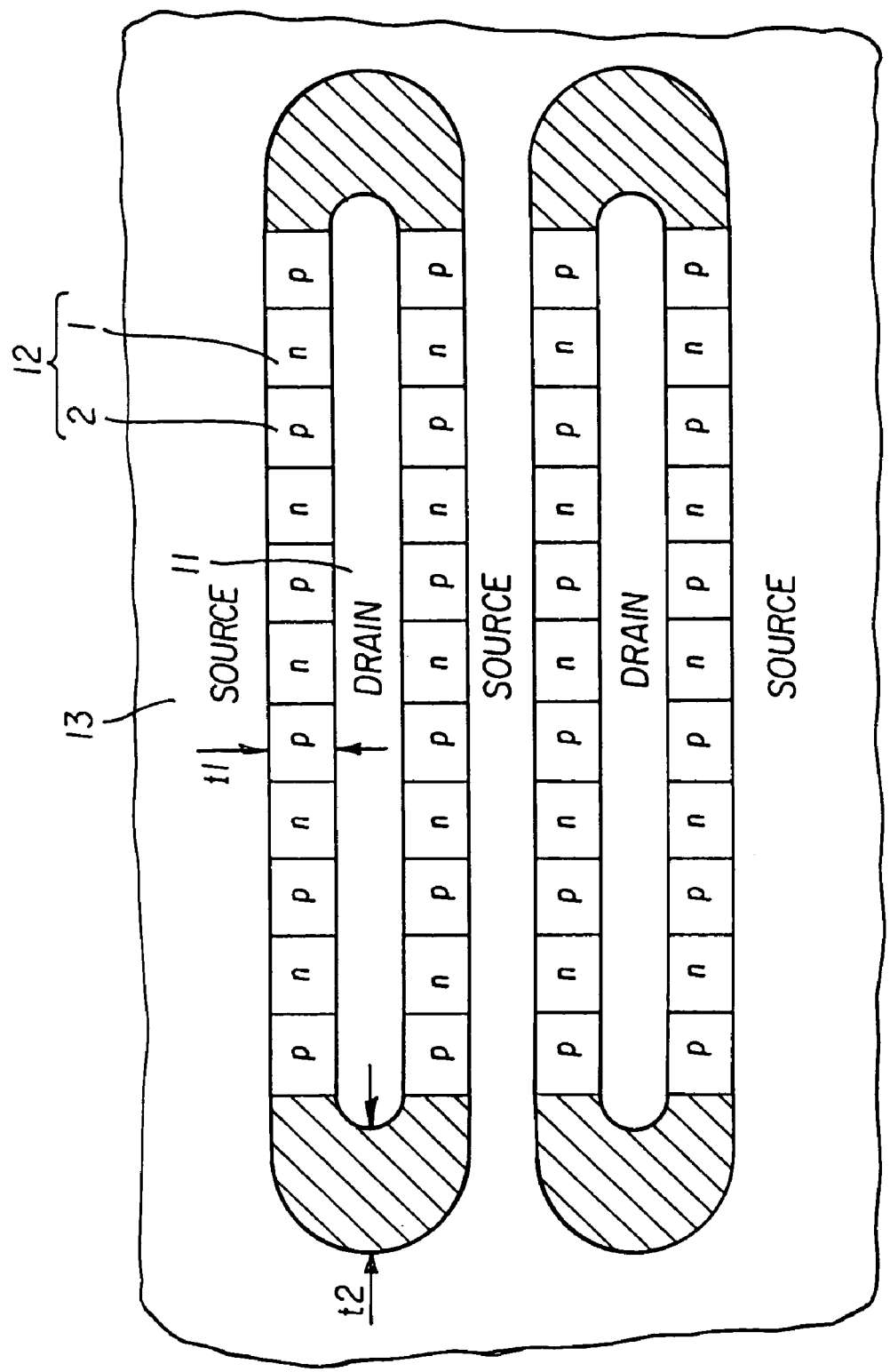
FIG. 9 is a top plan view of an n-channel lateral super-junction MOSFET according to a sixth embodiment of the invention.

FIG. 9 is a top plan view of an n-channel lateral super-junction MOSFET according to a sixth embodiment of the invention. The n-channel lateral super-junction MOSFET according to the sixth embodiment is a modification of the super-junction MOSFET according to the first embodiment. Referring now to FIG. 9, the lateral width $t_2$ of curved section 12b of alternating conductivity type layer 12 is larger than the lateral width $t_1$ of straight section 12a.

Since the breakdown voltage is roughly proportional to the lateral width of the alternating conductivity type layer in the lateral super-junction structure, the lateral width $t_2$ of curved section 12b, larger than the lateral width $t_1$ of straight section 12a, facilitates in providing curved section 12b with a breakdown voltage higher than the breakdown voltage of straight section 12a. When curved section 12b is formed of a lightly doped region 42 or an intrinsic region 41, curved section 12b wider than straight section 12a also facilitates in obtaining a higher breakdown voltage.

The method of using curved sections 12b wider than straight sections 12a to provide curved sections 12b with a higher breakdown voltage is applicable to the lateral super-junction MOSFET's according to the second through fifth embodiments.

Figure 10:
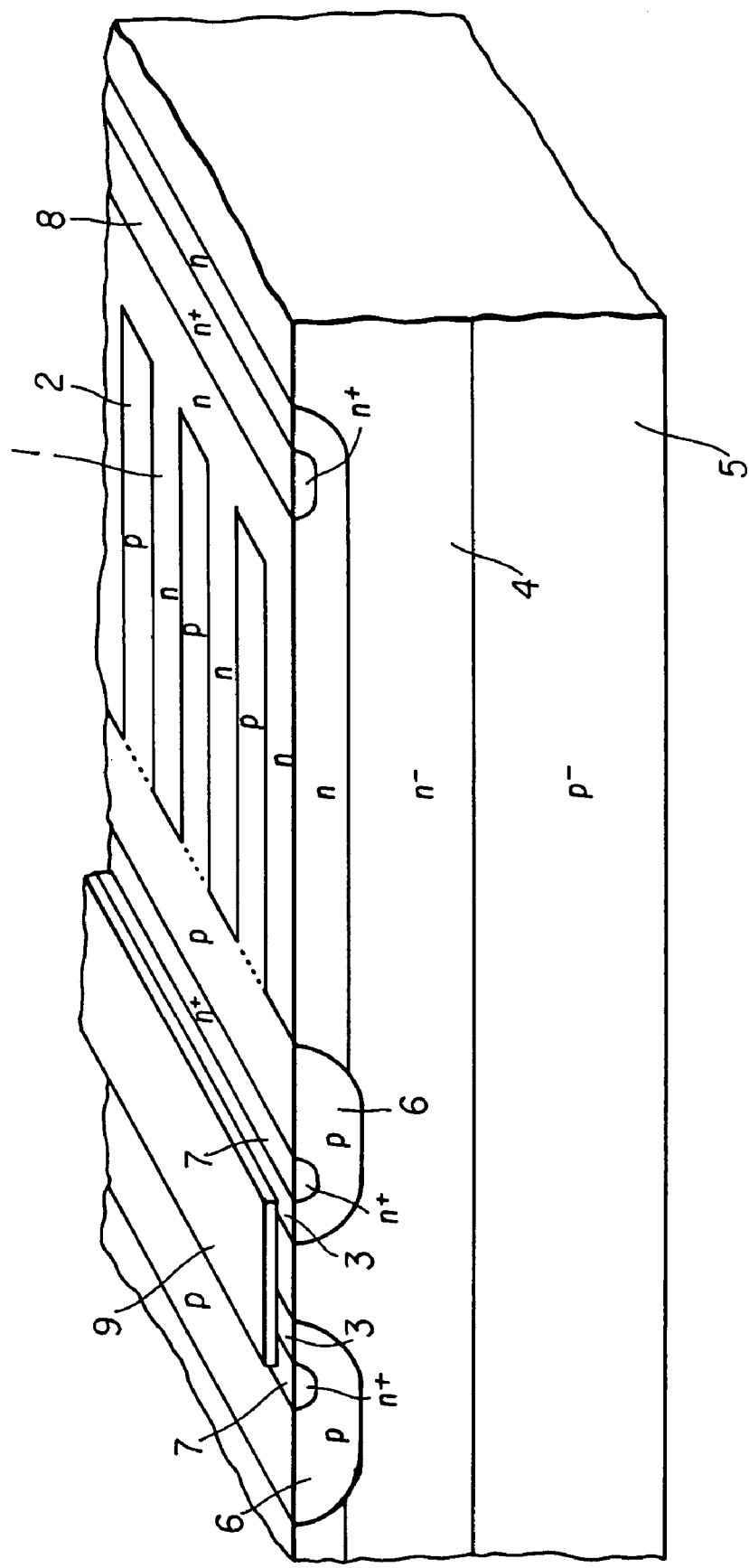
FIG. 10 is a perspective view of an n-channel lateral super-junction MOSFET, which is different from the super-junction MOSFET described in FIG. 2.

FIG. 10 is a perspective view of an n-channel lateral super-junction MOSFET, which is different from the super-junction MOSFET described in FIG. 2. In FIG. 10, the same reference numerals as in FIG. 2 are used to designate the same constituent elements. The gate region of the super-junction MOSFET described in FIG. 10 is different from that of the super-junction MOSFET described in FIG. 2.

Although the gate arrangement shown in FIG. 10 causes on-resistance to increase, the gate arrangement facilitates in improving the avalanche withstanding capability in driving an inductive load.

Although the invention has been described in connection with the embodiments of lateral MOSFET's, the invention is effectively applicable to other lateral semiconductor devices such as bipolar transistors, insulated gate bipolar transistors (IGBT's), pn.-diodes and Schottky diodes.

Seventh Embodiment

Figure 11:
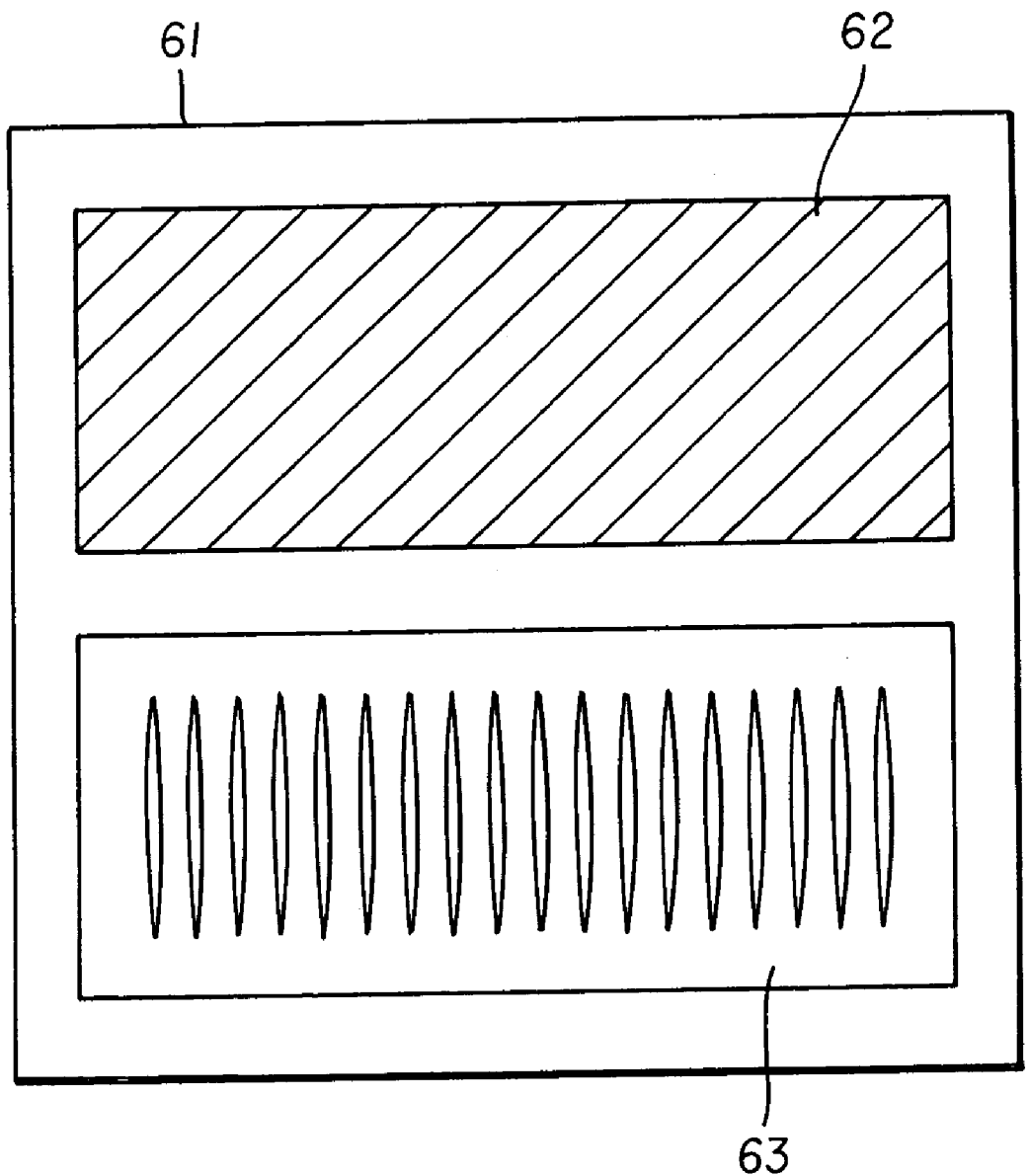
FIG. 11 is a top plan view of an intelligent power 1C, which employs the lateral super-junction semiconductor devices according to the invention.
Figure 12:
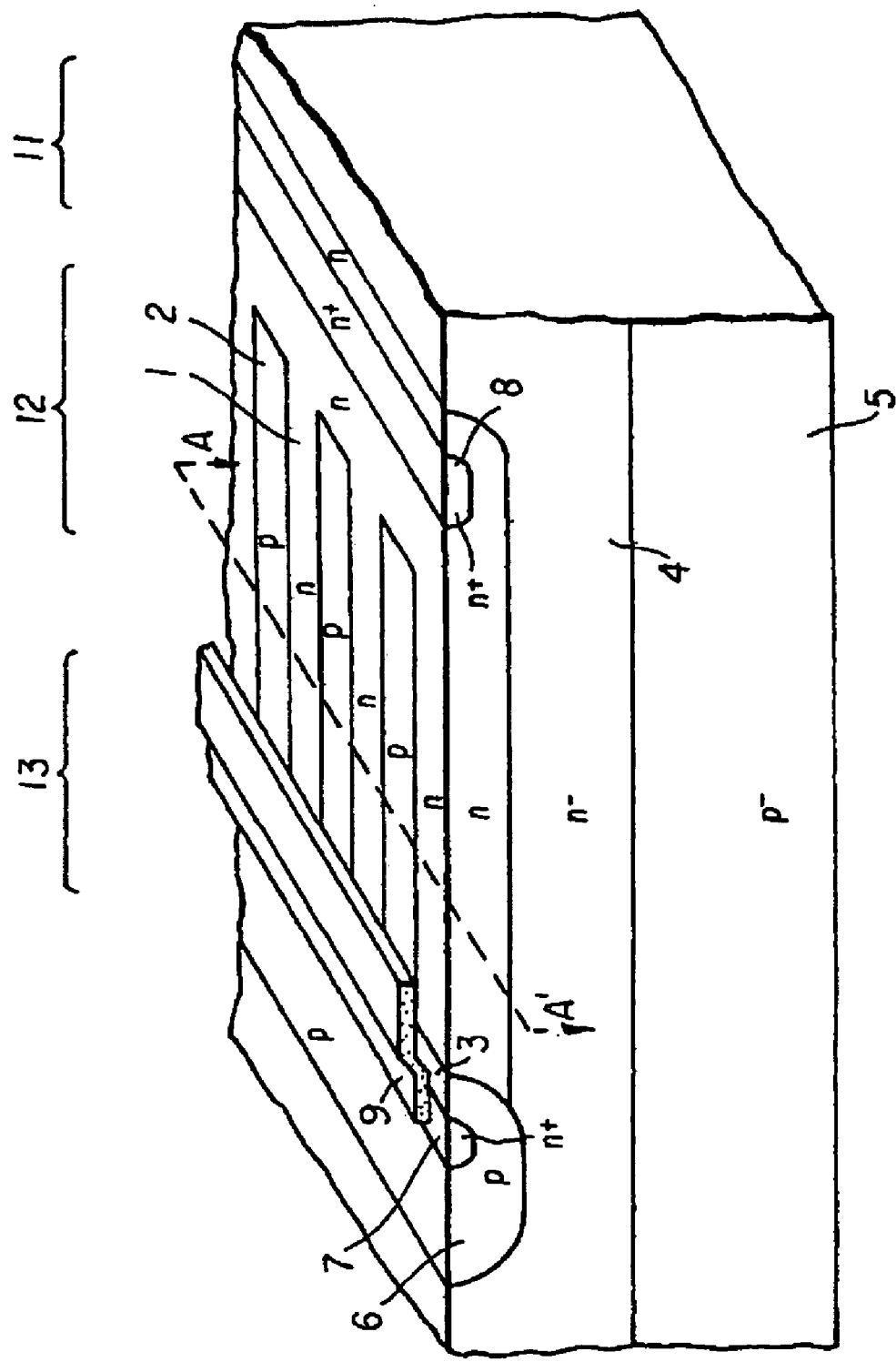
FIG. 12 is a perspective view of a fundamental lateral super-junction MOSFET.
Figure 13A:
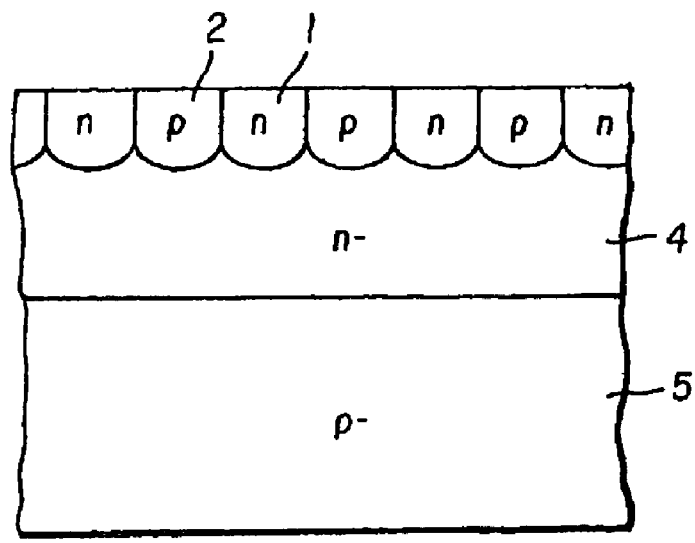
FIG. 13($a$) is a cross sectional view along A—A of FIG. 12.
Figure 13B:
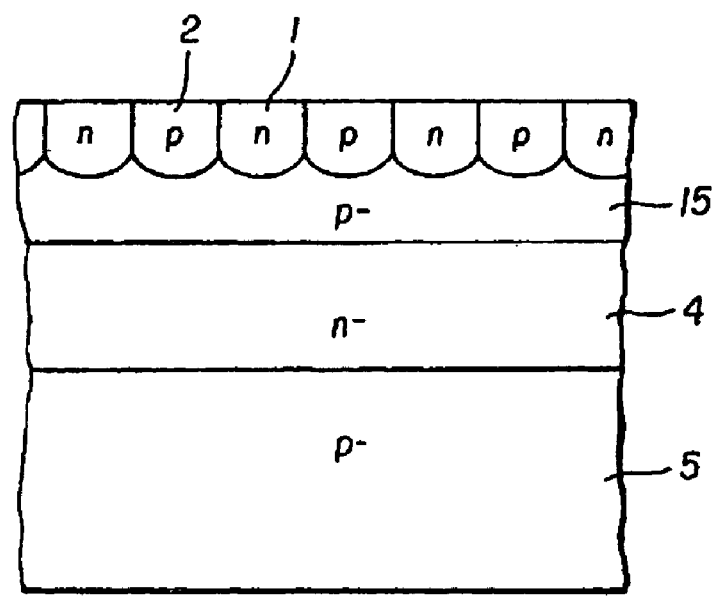

FIG. 11 is a top plan view of an intelligent power IC, which employs any of the lateral super-junction semiconductor devices described above. Referring to FIG. 11, lateral super-junction semiconductor devices 63 and a circuit 62 for control, protection and detection are all integrated on a semiconductor substrate 61. By integrating lateral super-junction semiconductor devices, a monolithic intelligent power IC that exhibits a high breakdown voltage and low on-resistance (low loss), is easily obtained with low manufacturing costs.

As described above, the lateral semiconductor device according to the invention includes: a semiconductor chip; two main electrodes on one of the major surfaces of the semiconductor chip; an alternating conductivity type layer between the main electrodes; the alternating conductivity type layer including drift regions of a first conductivity type and partition regions of a second conductivity type, the drift regions and the partition regions being arranged alternately, the drift regions providing a current path in the ON-state of the semiconductor device and being depleted in the OFF-state of the semiconductor device, the partition regions being depleted in the OFF-state of the semiconductor device; and the alternating conductivity type layer being a closed loop surrounding one of the main electrodes. By properly setting the pitches, thereat a pair of the drift region and the partition region is repeated in the straight sections and the curved sections of the closed loop of the alternating conductivity type layer, the tradeoff relation between the on-resistance and the breakdown voltage is reduced greatly and the lateral super-junction semiconductor device according to the invention is provided with a high breakdown voltage.

According to the invention, by properly adjusting the impurity concentrations, widths of the constituent regions, the depth and the width of the curved sections in the closed loop of the alternating conductivity type layer, a lateral super-junction semiconductor device, that exhibits a high breakdown voltage and is manufactured easily with excellent mass-productivity, is obtained.

What is claimed is:

1. A lateral semiconductor device comprising:
a semiconductor chip having two major surfaces;
two main electrodes on one of the major surfaces of the semiconductor chip;
one or more alternating conductivity type layers between the main electrodes, each alternating conductivity type layers comprising first semiconductor regions of a first conductivity type and second semiconductor regions of a second conductivity type, the first semiconductor regions and the second semiconductor regions being arranged alternately, the first semiconductor regions providing a current path in the ON-state of the semiconductor device and being depleted in the OFF-state of the semiconductor device, and the second semiconductor regions being depleted in the OFF-state of the semiconductor device; and
lightly doped regions having lower, impurity concentrations than those of the one or more alternating conductivity type layers,
wherein the one or more alternating conductivity type layers and the lightly doped regions are connected to each other to form a closed loop surrounding one of the main electrodes.

2. The lateral semiconductor device according to claim 1, wherein the closed loop comprises at least one straight section and at least one curved section.

3. The lateral semiconductor device according to claim 2, wherein the closed loop comprises at least two straight sections and at least two curved sections.

4. The lateral semiconductor device according to claim 3, wherein the closed loop comprises four or more straight sections and four or more curved sections.

5. The lateral semiconductor device according to claim 2, wherein the straight section comprises the alternating conductivity type layer and the curved section comprises the lightly doped regions.

6. The lateral semiconductor device according to claim 1, wherein the lightly doped regions are doped with an n-type impurity and a p-type impurity.

7. The lateral semiconductor device according to claim 1, further comprising one or more closed loops, each including one or more alternating conductivity type layers and lightly doped regions.

8. The lateral semiconductor device according to claim 1, wherein a width of each first semiconductor region or second semiconductor region is from ¼ to 4 times as large as the depth of the first semiconductor region or the second semiconductor region.

9. The lateral semiconductor device according to claim 1, wherein a length of the alternating conductivity type layer is from 12.5 to 100 times as large as the width of each first semiconductor region or second semiconductor region.

10. The lateral semiconductor device according to claim 1, wherein a length of the alternating conductivity type layer is from 12.5 to 100 times as large as a depth of each first semiconductor region or second semiconductor region.

11. The lateral semiconductor device according to claim 1, wherein the lateral semiconductor device comprises a semiconductor device selected from the group consisting of a MOSFET, a bipolar transistor, an IGBT and a diode; one of the main electrodes is inside the closed loop and has a high potential; and the other main electrode is outside the closed loop and has a low potential.

12. The lateral semiconductor device according to claim 1, further comprising a circuit for controlling the semiconductor device, for protecting the semiconductor device and for detecting states of the semiconductor device, the circuit being outside the closed loop.

13. A lateral semiconductor device comprising:
a semiconductor chip having two major surfaces;
two main electrodes on one of the major surfaces of the semiconductor chip;
one or more alternating conductivity type layers between the main electrodes, each of the alternating conductivity type layers comprising first semiconductor regions of a first conductivity type and second semiconductor regions of a second conductivity type, the first semiconductor regions and the second semiconductor regions being arranged alternately, the first semiconductor regions providing a current path in the ON-state of the semiconductor device and being depleted in the OFF-state of the semiconductor device, and the second semiconductor regions being depleted in the OFF-state of the semiconductor device; and lightly doped regions having substantially low impurity concentrations, wherein the one or more alternating conductivity type layers and the lightly doped regions are connected to each other to form a closed loop surrounding one of the main electrodes, wherein surface portions of the lightly doped regions are substantially intrinsic.

14. A lateral semiconductor device comprising:

a semiconductor chip having two major surfaces;

two main electrodes on one of the major surfaces of the semiconductor chip;

one or more alternating conductivity type layers between the main electrodes, each of the alternating conductivity type layers comprising first semiconductor regions of a first conductivity type and second semiconductor regions of a second conductivity type, the first semiconductor regions and the second semiconductor regions being arranged alternately, the first semiconductor regions providing a current path in the ON-state of the semiconductor device and being depleted in the OFF-state of the semiconductor device, and the second semiconductor regions being deleted in the OFF-state of the semiconductor device; and lightly doped regions having substantially low impurity concentrations, wherein the one or more alternating conductivity type layers and the lightly doped regions are connected to each other to form a closed loop surrounding one of the main electrodes, wherein the closed loop comprises at least one straight section and at least one curved section, and wherein a width of at least a portion of the curved section is larger than a width of the straight section.

15. A lateral semiconductor device comprising:

a semiconductor chip having two major surfaces;

two main electrodes on one of the major surfaces of the semiconductor chip;

one or more alternating conductivity type layers between the main electrodes, each alternating conductivity type layer comprising first semiconductor regions of a first conductivity type and second semiconductor regions of a second conductivity type, the first semiconductor regions and the second semiconductor regions being arranged alternately, the first semiconductor regions providing a current path in the ON-state of the semiconductor device and being deleted in the OFF-state of the semiconductor device, and the second semiconductor regions being deleted in the OFF-state of the semiconductor device; and lightly doped regions having substantially low impurity concentrations, wherein the one or more alternating conductivity type layers and the lightly doped regions are connected to each other to form a closed loop surrounding one of the main electrodes, wherein a width of at least a portion of the lightly doped regions is larger than a width of the alternating conductivity type layer.

* * * * *